(12) United States Patent
Lee

(10) Patent No.: US 9,558,835 B2
(45) Date of Patent: Jan. 31, 2017

(54) SEMICONDUCTOR DEVICE AND OPERATING METHOD THEREOF

(71) Applicant: SK hynix Inc., Icheon-si Gyeonggi-do (KR)

(72) Inventor: Yeonghun Lee, Seongnam-si (KR)

(73) Assignee: SK HYNIX INC., Icheon-si (KR)

(*) Notice: Subject to any disclaimer, the term of this patent is extended or adjusted under 35 U.S.C. 154(b) by 0 days.

(21) Appl. No.: 14/992,190

(22) Filed: Jan. 11, 2016

(65) Prior Publication Data
US 2016/0372204 A1 Dec. 22, 2016

(30) Foreign Application Priority Data

Jun. 22, 2015 (KR) .................. 10-2015-0088454
Nov. 6, 2015 (KR) .................. 10-2015-0156065

(51) Int. Cl.
*G11C 16/06* (2006.01)
*G11C 16/16* (2006.01)
*G11C 16/08* (2006.01)

(52) U.S. Cl.
CPC .............. *G11C 16/16* (2013.01); *G11C 16/08* (2013.01)

(58) Field of Classification Search
CPC . G11C 16/0483; G11C 16/16; G11C 16/3459; G11C 16/30; G11C 16/12; G11C 16/3454; G11C 16/344; G11C 11/5635; G11C 16/3418; G11C 16/14; G11C 16/24; G11C 16/3445; G11C 16/10; G11C 16/3427; G11C 11/5628; G11C 16/0433

USPC ........... 365/185.17, 185.29, 185.11, 185.18, 365/185.28, 185.19, 185.22, 185.23, 365/185.24, 185.03, 185.3, 185.33
See application file for complete search history.

(56) References Cited

U.S. PATENT DOCUMENTS

2015/0155047 A1* 6/2015 Kim ................... G11C 16/107
365/185.29

FOREIGN PATENT DOCUMENTS

KR 10-2012-0037187 A 4/2012

* cited by examiner

*Primary Examiner* — Thong Q Le
(74) *Attorney, Agent, or Firm* — William Park & Associates Ltd.

(57) ABSTRACT

Disclosed are a semiconductor device and an operating method thereof. The semiconductor device includes a plurality of memory blocks including cell strings coupled between bit lines and a source line, a peripheral circuit configured to perform an erase operation on a selected memory block among the plurality of memory blocks; and a control circuit configured to control the peripheral circuit, so that when an erase command is received, local word lines coupled to a non-selected memory block among the plurality of memory blocks are pulled to ground, the local word lines coupled to the non-selected memory block float after a pre-erase voltage lower than an erase voltage is applied to the source line, and the erase operation of the selected memory block is performed by applying the erase voltage to the source line.

15 Claims, 12 Drawing Sheets

SEMICONDUCTOR DEVICE AND OPERATING METHOD THEREOF

CROSS-REFERENCE TO RELATED APPLICATION

The present application claims priority to Korean patent application number 10-2015-0088454 filed on Jun. 22, 2015 and priority from Korean Patent Application No. 10-2015-0156065 filed on Nov. 6, 2015, in the Korean Intellectual Property Office, the entire disclosure of which is herein incorporated by reference in its entirety.

BACKGROUND

1. Field

The present disclosure generally relates to an integrated circuit and an operating method thereof, and more particularly to a semiconductor memory device and an operating method thereof.

2. Discussion of Related Art

A semiconductor memory device may be split into two categories, volatile memories and non-volatile memories. The volatile memory device does not retain when power is turned off, and the non-volatile memory device can retain data even in the absence of power supplies.

Flash memory is one of the non-volatile memories that can be used to store general data and configuration data in portable electronic devices such as mobile phones and notebook computers. The flash memory may be split into NAND flash memory and NOR flash memory. The NOR flash memory, which is comprised of memory cells connected in parallel, requires contacts on the bit lines and thus requires much more space, whereas the NAND flash memory, which is comprised of memory cells connected in series and do not require as many metal contacts as NOR flash memory, may enable high density and low cost. For that reason, NAND flash memory devices are being widely used in portable memory devices such as memory cards, Universal Serial Bus (USB) drives, Solid-State Drives (SSD).

SUMMARY

The present disclosure provides a semiconductor device capable of decreasing stress of non-selected memory blocks and a row decoder during an erase operation of the semiconductor device, and an operating method thereof.

An exemplary embodiment of the present disclosure provides a semiconductor device including: a plurality of memory blocks including cell strings connected between bit lines and a source line; a peripheral circuit configured to perform an erase operation of a selected memory block among the memory blocks; and a control circuit configured to control the peripheral circuit, so that when an erase command is received, local word lines connected to a non-selected memory block among the memory blocks are grounded, the local word lines connected to the non-selected memory block are floated after a pre-erase voltage lower than an erase voltage is applied to the source line, and the erase operation of the selected memory block is operated by applying the erase voltage to the source line.

Another exemplary embodiment of the present disclosure provides a method of operating a semiconductor device, including: grounding first word lines connected to the first memory blocks; applying a pre-erase voltage lower than an erase voltage to a source line, to which the erase voltage is applied; floating the first word lines; and erasing memory cells included in a second memory block by applying the erase voltage to the source line.

Yet another exemplary embodiment of the present disclosure provides a method of operating a semiconductor device, including: connecting global word lines to local word lines connected to non-selected memory blocks; grounding the global word lines; applying a pre-erase voltage to a source line arranged between memory blocks; floating local word lines connected to the non-selected memory blocks; connecting the global word lines to local word lines connected to a selected memory block; and erasing memory cells included in the selected memory block by applying an erase voltage higher than the pre-erase voltage to the source line.

According to the exemplary embodiments of the present disclosure, it is possible to decrease stress of non-selected memory blocks and a row decoder during an erase operation, and thus to secure a breakdown voltage margin of the row decoder, thereby improving a degree of integration of a semiconductor device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, various embodiments of the present disclosure will be described in detail with reference to the accompanying drawings. However, the present disclosure is not limited to embodiments to be disclosed below, but various forms different from each other may be implemented.

Figure 1:
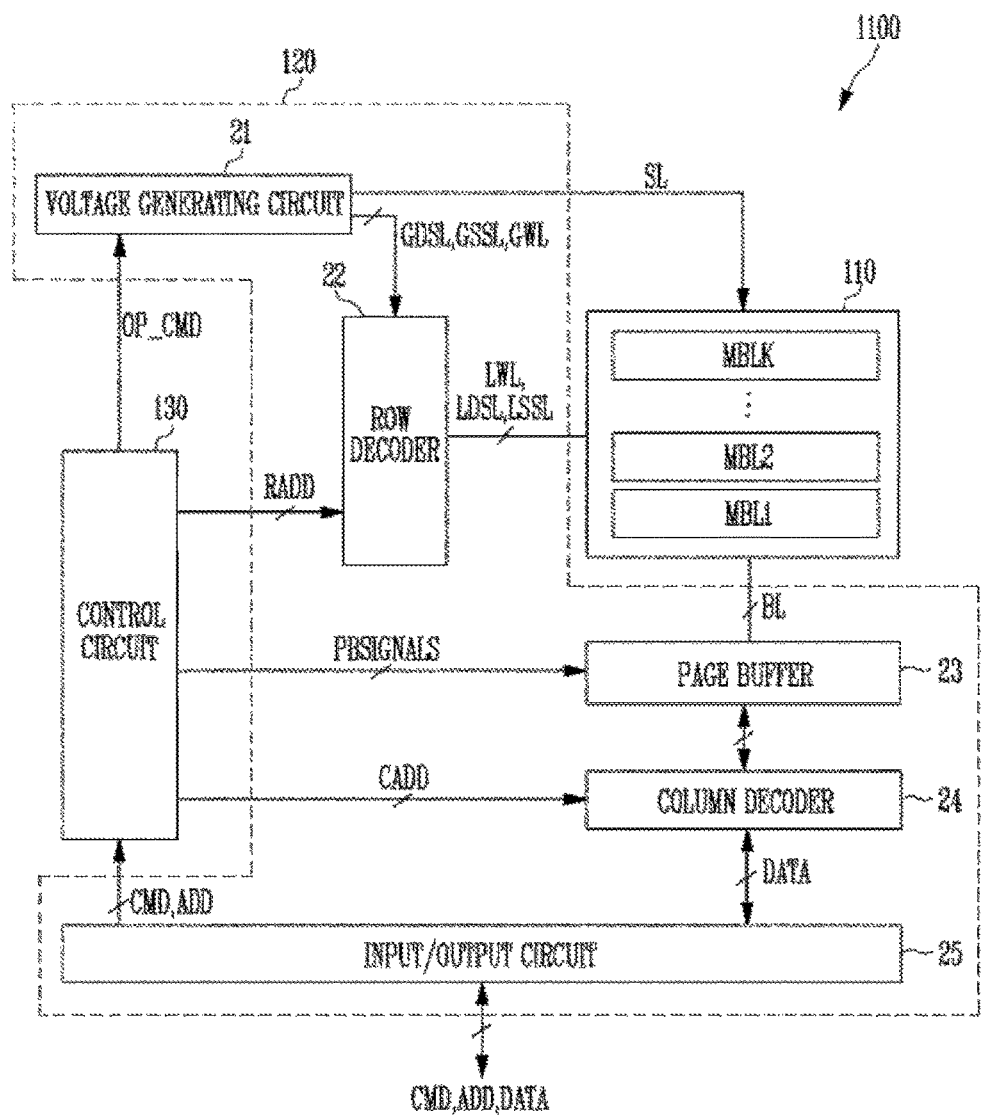
FIG. 1 is a diagram schematically illustrating a semiconductor device according to an example embodiment of the present disclosure.

FIG. 1 is a diagram schematically illustrating a semiconductor device according to an example embodiment of the present disclosure.

Referring to FIG. 1, a semiconductor device 1100 includes a memory cell array 110, a peripheral circuit 120, and a control circuit 130. The peripheral circuit 120 carries out various operations such as program, read, or erase operations on the memory cell array 110, and the control circuit 130 supervises the execution of the operations carried out by the peripheral circuit 120.

The memory cell array 110 includes a plurality of memory blocks MBL1 to MBLk. The memory blocks MBL1 to MBLk may be formed in a 2D or 3D structure. For example, the memory blocks in the 2D structure includes a plurality of cell strings horizontally arranged with respect to a semiconductor substrate, and the memory blocks in the 3D structure includes a plurality of cell strings vertically arranged with respect to the semiconductor substrate. The cell strings are connected between bit lines BL and a source line SL.

The peripheral circuit 120 may include a voltage generating circuit 21, a row decoder 22, a page buffer 23, a column decoder 24, and an input/output circuit 25.

The voltage generating circuit 21 generates operating voltages of various levels in response to an operation signal OP_CMD. The operation command signal OP_CMD may include a program command signal, a read command signal, and an erase command signal. In the erase operation, the voltage generating circuit 21 may generate a pre-erase voltage, an erase voltage, a turn-on voltage, and a turn-off voltage in response to the erase command signal. The pre-erase voltage or the erase voltage may be applied to a source line SL. The turn-on voltage or the turn-off voltage may be applied to select lines such as a global drain select line GDSL and a global source select line GSSL. Further, the voltage generating circuit 21 may apply a ground voltage to word lines GWL or apply a voltage that sets global word lines GWL at ground. Here, the ground voltage may a voltage that sets a signal line at ground or approximately ground. The ground may mean zero volts or approximately zero volts.

The row decoder 22 transmits operation voltages to local word lines LWL, local drain select lines LDSL, and local source select lines LSSL coupled to a memory block selected among the memory blocks MBL1 to MBLk included in the memory cell array 110 in response to a row address RADD.

The page buffer 23 is coupled to the memory blocks MBL1 to MBLk through the bit lines BL, exchanges data with the selected memory block during the program and read operations in response to a page buffer control signal PBSIGNALS, and temporarily stores data.

The column decoder 24 exchanges data with the page buffer 23 in response to a column address CADD.

The input/output circuit 25 transmits a command CMD and an address ADD received from the outside to the control circuit 130, and transmits the data DATA received from the outside to the column decoder 24 or outputs the data DATA received from the column decoder 24.

The control circuit 130 controls the peripheral circuit 120 in response to the command CMD and the address ADD. For example, the control circuit 130 outputs the operation signal OP_CMD, the row address RADD, the page buffer control signal PBSIGNALS, and the column address CADD to the peripheral circuit 120 so that the program operation, the read operation, or the erase operation is performed in response to the command CMD and the address ADD. In the erase operation, the control circuit 130 controls the peripheral circuit 120 so that the erase operation can be performed only on the selected memory block. For example, the pre-erase voltage is applied to the source line WL before the erase operation is performed on the selected memory block, and the ground voltage is applied to the local word lines LWL coupled to non-selected memory blocks in order to prevent a voltage on the local word lines LWL coupled to the non-selected memory blocks from increasing during the erase operation of the selected memory block. The pre-erase voltage is higher than the ground voltage and is lower than the erase voltage.

When increasing a voltage of the source line SL, the control circuit 130 controls the peripheral circuit 120 so that the local word lines LWL coupled to the non-selected memory blocks is pulled to ground before the voltage of the source line SL reaches the erase voltage. When the local word lines LWL coupled to the non-selected memory blocks are set at ground, the voltage on the local word lines LWL coupled to the non-selected memory blocks may be maintained at zero volts or approximately zero volts even if the pre-erase voltage is applied to the source line WL.

In order to perform the erase operation, it is necessary to control the row decoder 22. An example configuration of the row decoder 22 will be described below.

Figure 2:
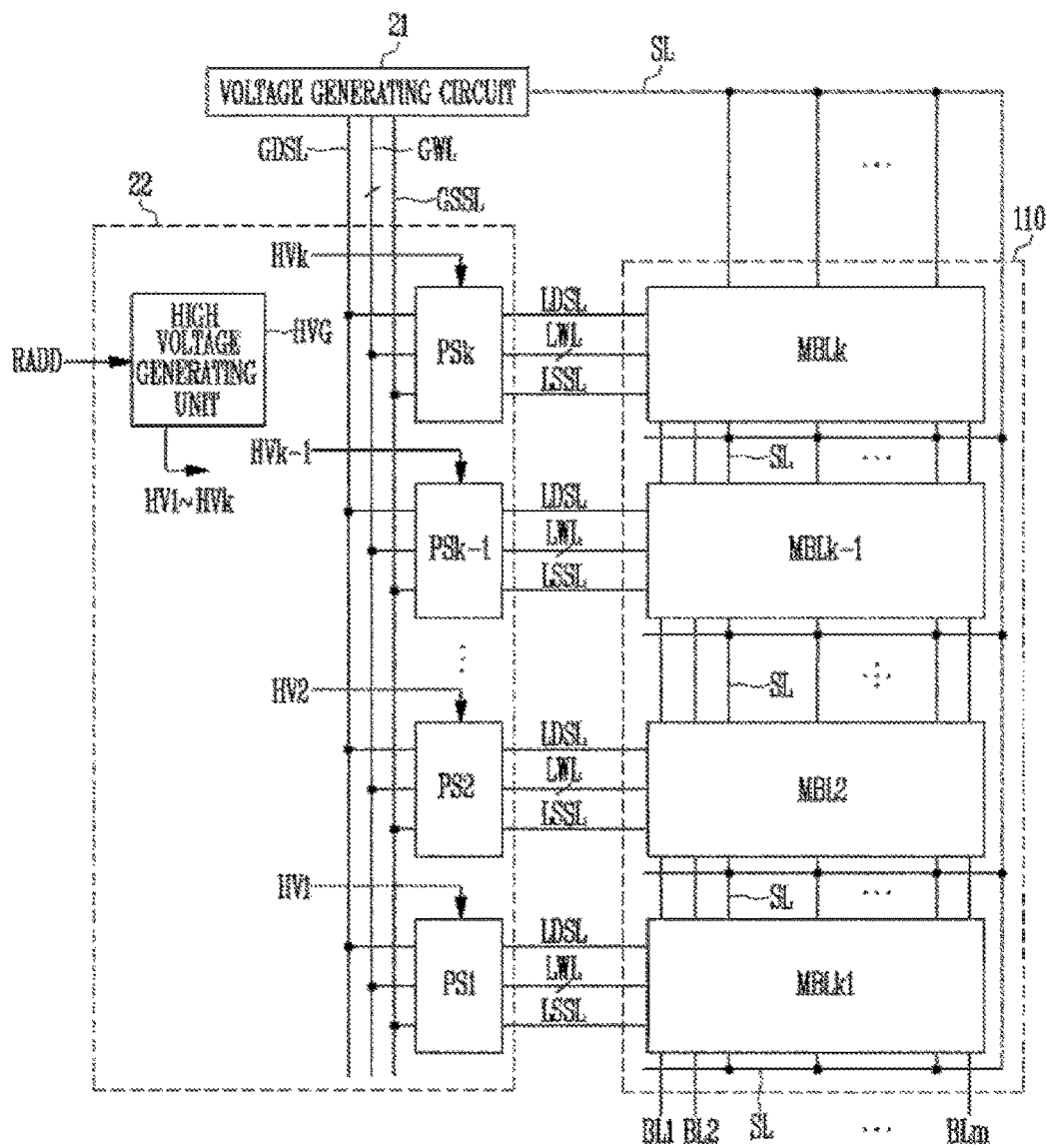
FIG. 2 is a diagram for describing a row decoder of FIG. 1 in detail.

FIG. 2 is a diagram for describing the row decoder of FIG. 1 in detail.

Referring to FIG. 2, the row decoder 22 may include a high voltage generating circuit HVG and first to $k^{th}$ path switching circuits PS1 to PSk. FIG. 2 illustrates only one high voltage generating circuit HVG, but in another embodiment, a semiconductor device may include a plurality of high voltage generating circuits.

The high voltage generating circuit HVG may generate first to $K^{th}$ high voltages HV1 to HVk in response to the row address RADD. In an embodiment, when the high voltage generating circuit HVG generates a high voltage for activating a selected pass switching circuit in response to the row address RADD, the high voltage generating circuit HVG may not generate a high voltage for non-selected pass switching circuits. In an embodiment, when the high voltage generating circuit HVG generates the high voltage for activating the non-selected pass switching circuit in response to the row address RADD, the high voltage generating circuit HVG may not generate the high voltage for the selected pass switching circuit. In an embodiment, the high voltage generating circuit HVG may generate high voltages for simultaneously activating non-selected pass switching circuits and selected pass switching circuits in response to the row address RADD.

The first to $k^{th}$ pass switching circuits PS1 to PSk are coupled in common to the voltage generating circuit 21 through the global lines GDSL, GWL, and GSSL. The first to $k^{th}$ pass switching circuits PS1 to PSk are also coupled to the memory blocks MBL1 to MBLk, respectively, through the local lines LDSL, LWL, and LSSL. Further, the first to $k^{th}$ pass switching circuits PS1 to PSk may couple the global lines GDSL, GWL, and GSSL to the local lines LDSL, LWL, and LSSL coupled to the selected memory block, or may couple the global lines GDSL, GWL, and GSSL to the local lines LDSL, LWL, and LSSL coupled to the non-selected memory block in response to the first to $k^{th}$ high voltages HV1 to HVk.

The global lines GDSL, GWL, and GSSL may include the global drain select line GDSL, the global word lines GWL, and the global source select line GSSL. The local lines LDSL, LWL and LSSL may include the local drain select line LDSL, the local word lines LWL, and the local source select line LSSL. For example, when a first high voltage HV1 is applied to the first pass switching circuit PS1, the second to $k^{th}$ high voltages HV2 to HVk are not applied to the remaining second to $k^{th}$ pass switching circuits PS2 to PSk. Accordingly, only the first pass switching circuit PS1 is activated, so that the voltages applied to the global lines GDSL, GWL, and GSSL are transmitted to the local lines LDSL, LWL, and LSSL coupled to the first memory block MBL1, respectively. In this case, the remaining second to $k^{th}$ pass switching circuits PS2 to PSk are inactivated, so that the voltages applied to the global lines GDSL, GWL, and GSSL are not transmitted to the second to $k^{th}$ memory blocks MBL2 to MBLk. In an embodiment, when the second to $k^{th}$ high voltages HV2 to HVk are generated, the second to $k^{th}$ pass switching circuits PS2 to PSk are activated, so that the voltages applied to the global lines GDSL, GWL, and GSSL are transmitted to the local lines LDSL, LWL, and LSSL coupled to the second to $k^{th}$ memory blocks MBL2 to MBLk, respectively. In this case, the remaining first pass switching circuit PS1 is inactivated, so that the voltages applied to the global lines GDSL, GWL, and GSSL are not transmitted to the first memory block MBL1.

Figure 3:
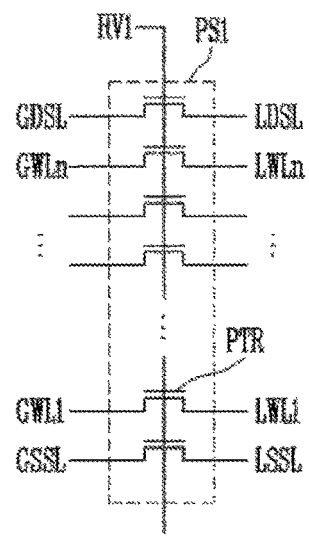
FIG. 3 is a circuit diagram illustrating a pass switching circuit of FIG. 1 in detail.

FIG. 3 is a circuit diagram illustrating the pass switching circuit of FIG. 1 in detail.

The first to $k^{th}$ pass switching circuits PS1 to PSk illustrated in FIG. 2 may have the same configuration as one another. In FIG. 3, therefore, the first pass switching circuit is illustrated as an example.

The first pass switching circuit PS1 may couple the global lines GDSL, GWL, and GSSL to the local lines LDSL, LWL, and LSSL. The first pass switching circuit PS1 includes a plurality of pass switches PTR operating in response to the first high voltage HV1. The pass switches PTR may include NMOS transistors. Since gates of the pass switches PTR are coupled in common to a signal line, when the first high voltage HV1 is applied to the gates through the signal line, the pass switches PTR are simultaneously turned on, and thus couple the global drain select line GDSL to the local drain select line LDSL, the global word lines GWL to the local word lines LWL, and the global source select line GSSL to the local source select line LSSL.

Figure 4:
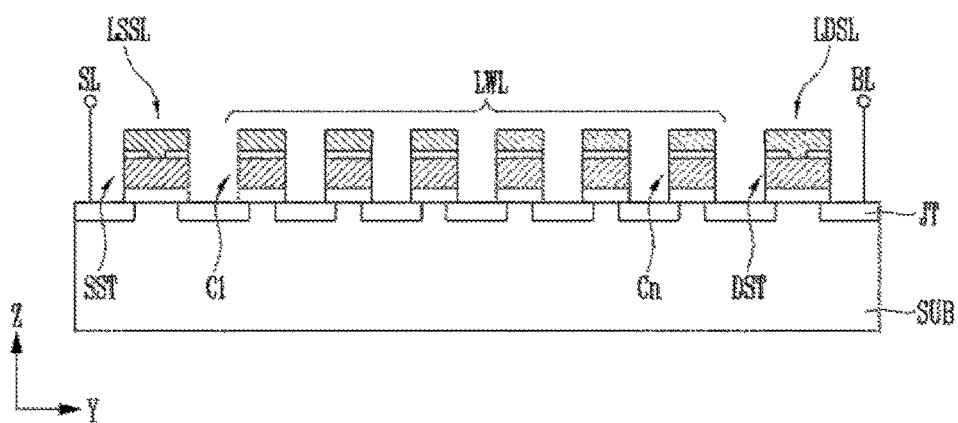
FIG. 4 is a perspective view for describing a memory block having a 2D structure.

FIG. 4 is a perspective view for describing a memory block having a 2D structure.

Referring to FIG. 4, the memory block having the 2D structure may include a source select transistor SST, memory cells C1 to Cn, and a drain select transistor DST arranged between a bit line BL and a source line SL. A junction region JT may be formed on a substrate SUB between the source select transistor SST, the memory cells C1 to Cn, and the drain select transistor DST.

A gate of the source select transistor SST may be connected to a local source select line LSSL, gates of the memory cells C1 to Cn may be connected to local word lines LWL, and a gate of the drain select transistor DST may be connected to a local drain select line DSL.

A drain junction region JT of the drain select transistor DST may be connected to the bit line BL, and a source junction region JT of the source select transistor SST may be connected to the source line SL.

More particularly, the source select transistor SST, the memory cells C1 to Cn, and the drain select transistor DST may include tunnel insulating layers, floating gates, dielectric layers, and control gates which are sequentially laminated on the substrate SUB (in a Z-direction). The tunnel insulating layers may be formed of an oxide layer, and the floating gates and the control gates may be formed of a doped poly silicon layer. The dielectric layers may be formed in a laminated structure including an oxide layer, a nitride layer, and an oxide layer, or a high-dielectric (high-k) layer. In the source select transistors connected to the source select lines SSL and the drain select transistors connected to the drain select lines DSL, some of the dielectric layers are remoted, so that the floating gates and the control gates may come into contact with each other. In the memory cells connected to the word lines WL, the floating gates and the control gates may be isolated from each other by the dielectric layers.

Figure 5:
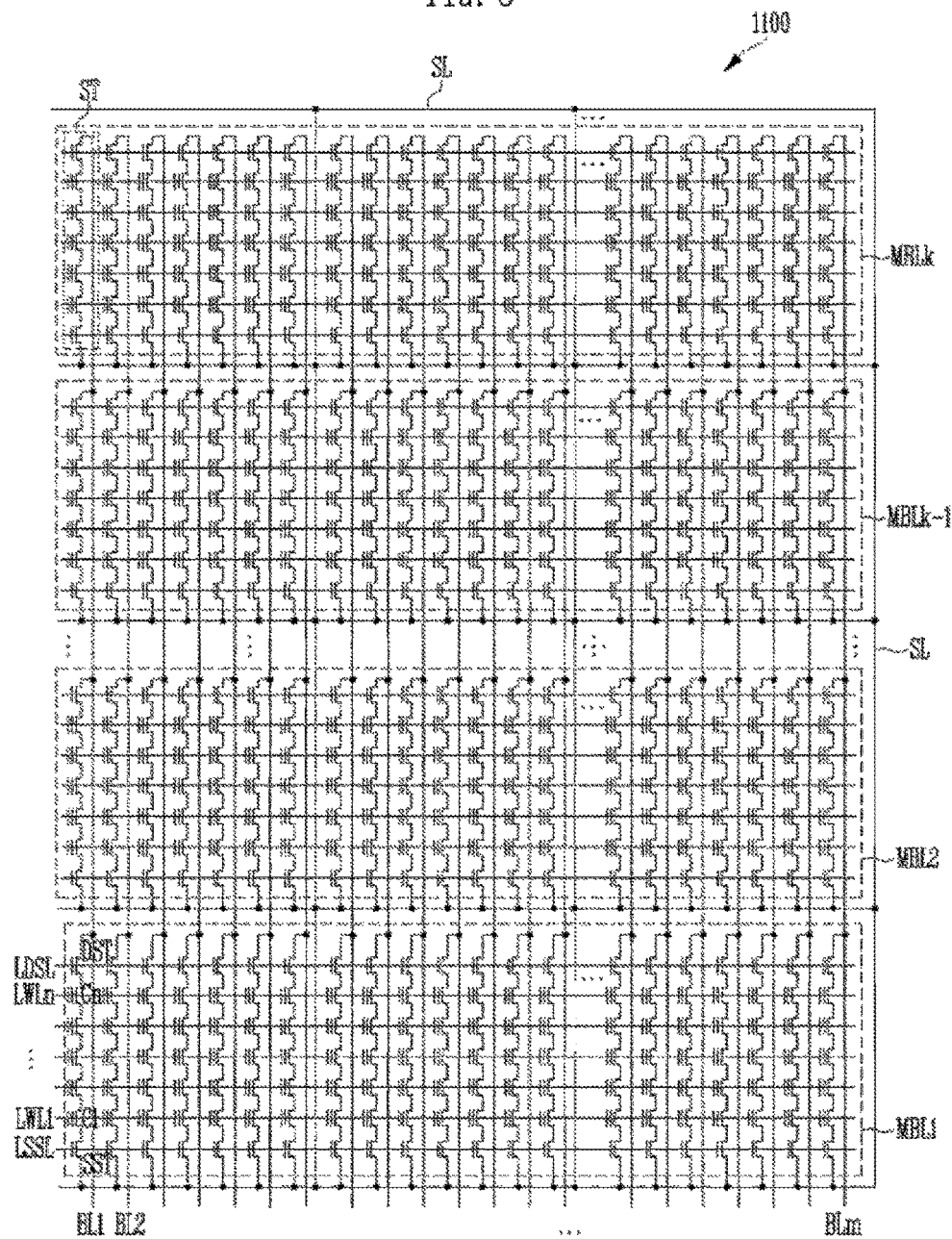
FIG. 5 is a circuit diagram illustrating the memory block of FIG. 1.

FIG. 5 is a circuit diagram illustrating the memory block of FIG. 1.

Referring to FIG. 5, the memory cell array 1100 includes the first to $k^{th}$ memory blocks MBL1 to MBLk. The first to $k^{th}$ memory blocks MBL1 to MBLk share the bit lines BL, and each includes the plurality of cell strings ST coupled between the bit lines BL and the source line SL. The cell strings ST may include drain select transistors DST, memory cells C1 to Cn, and source select transistors SST coupled in series between the bit lines BL and the source line SL. Gates of the drain select transistors DST included in different strings ST in the same memory block are coupled to the local drain select line LDSL, gates of the memory cells C1 to Cn are coupled to the local word lines LWL1 to LWLn, and gates of the source select transistors SST are coupled to the local source select line LSSL.

The source line SL is arranged between the first to $k^{th}$ memory blocks MBL1 to MBLk. Accordingly, regardless of the selected memory block, when the voltage generated by the voltage generating circuit 21 (see FIG. 2) is applied to the source line SL, the voltage is applied to the source line SL coupled to the first to $k^{th}$ memory blocks MBL1 to MBLk.

Figure 6:
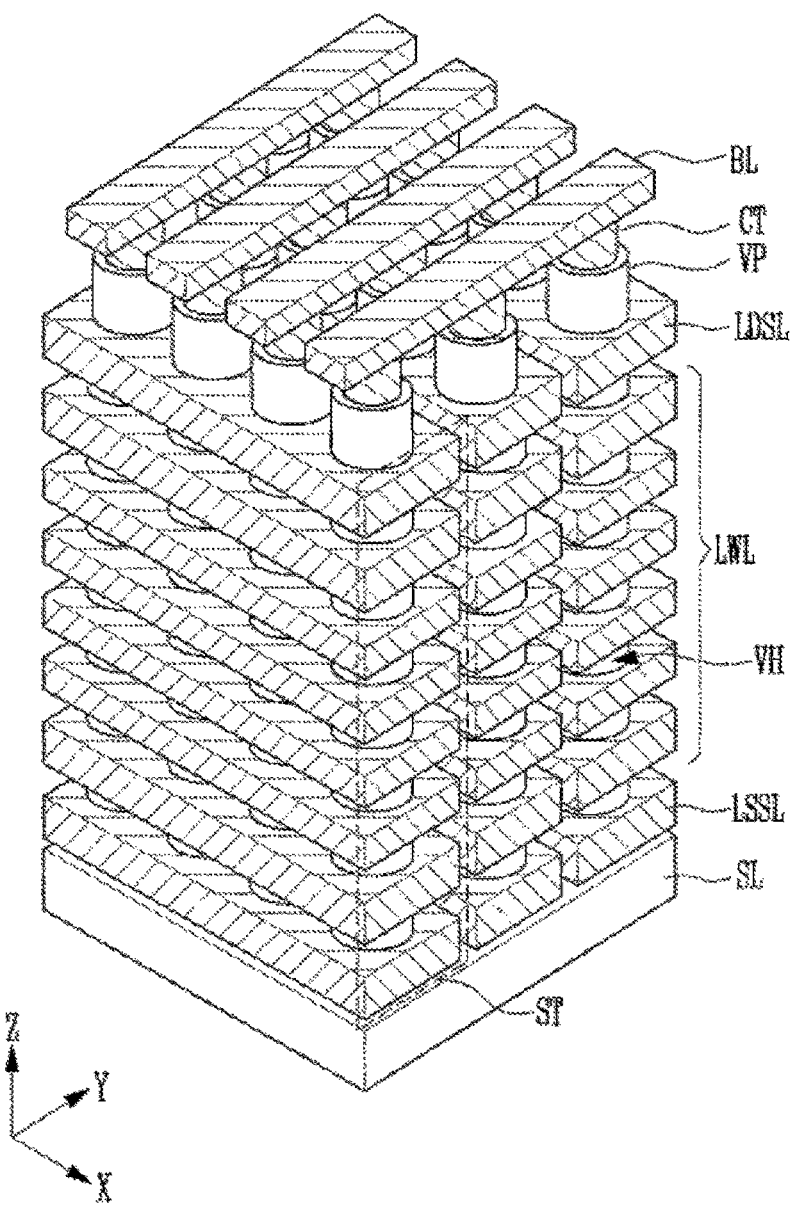
FIG. 6 is a perspective view for describing an exemplary embodiment of a memory block having a 3D structure.

FIG. 6 is a perspective view for describing an exemplary embodiment of a memory block having a 3D structure.

Referring to FIG. 6, the memory block having the 3D structure is vertically (the Z-direction) formed in the form of "I" on a substrate, and includes cells strings arranged between bit lines BL and a source line SL. Such a structure is also called a Bit Cost Scalable (BiCS) structure. For example, when the source line SL is horizontally formed on the substrate, the cell strings having the BiCS structure may be formed on the source line SL in the vertical direction. More particularly, the cell strings may include local source select lines LSSL, local word lines LWL, and local drain select lines LDSL which are arranged in a first direction (a Y-direction) and laminated while being spaced apart from each other. The numbers of local source select lines LSSL, local word lines LWL, and local drain select lines LDSL is not limited to those of FIG. 6, and may be different depending on a storage device. The cell strings may include vertical plugs VP which vertically pass through the local source select lines LSSL, the local word lines LWL, and the local drain select lines LDSL, and the bit lines BL which are in contact with upper portions of the vertical plugs VP protruding to the upper portions of the local drain select lines LDSL and arranged in a second direction (X-direction) orthogonal to the first direction (Y-direction). Further, contact plugs CT may be formed between the bit lines BL and the vertical plugs VP.

Figure 7:
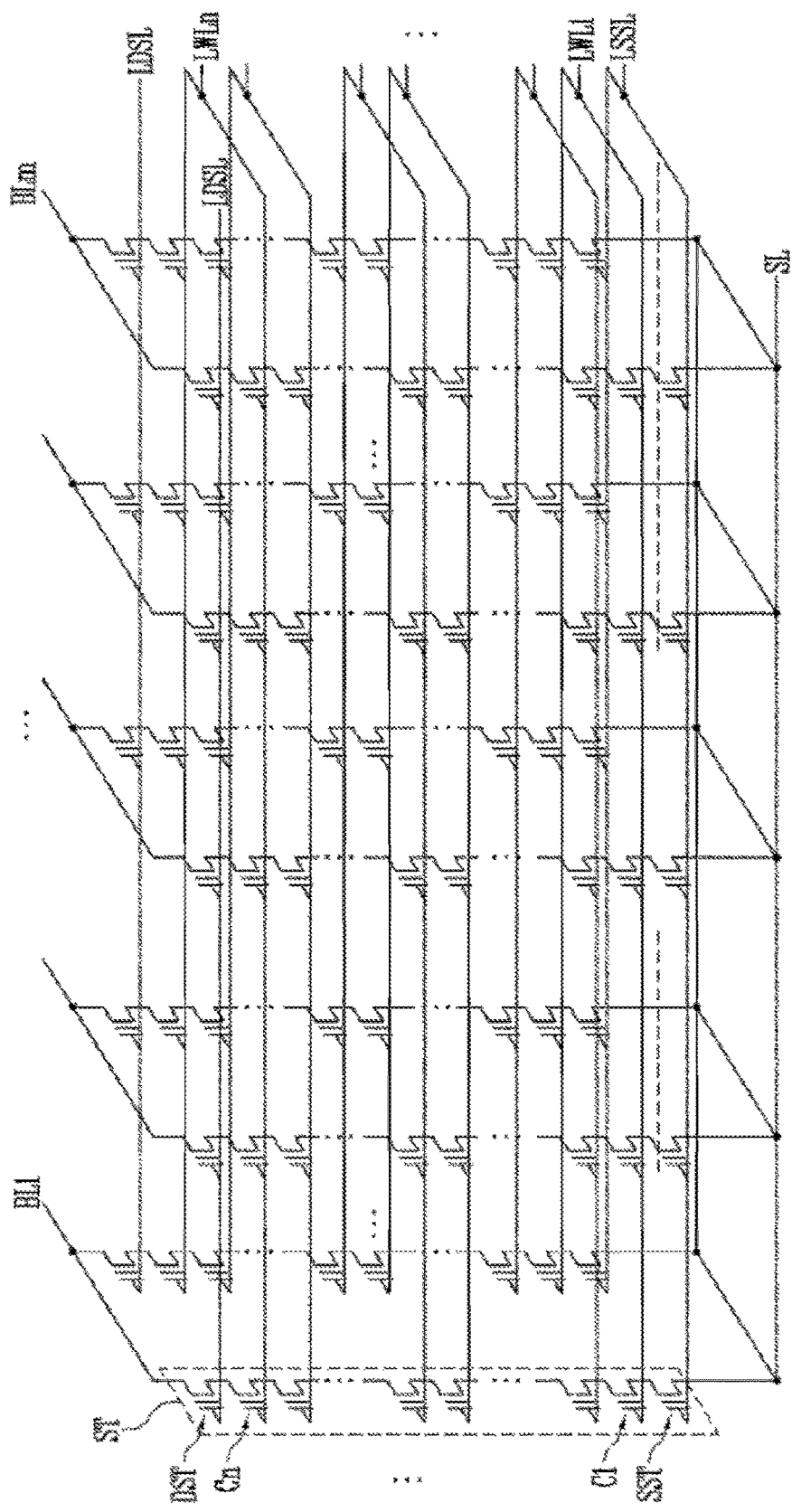
FIG. 7 is a circuit diagram illustrating the memory block of FIG. 6.

FIG. 7 is a circuit diagram illustrating the memory block of FIG. 6.

Referring to FIG. 7, any one of the memory blocks having the 3D structure of the BiCS structure is illustrated as an exemplary embodiment. In the memory block having the 3D structure, the cell strings ST are connected between the bit lines BL1 to BLm and the source line SL, and are arranged vertically to the semiconductor substrate.

The cell strings ST includes source select transistors SST, a plurality of memory cells C1 to Cn, and drain select transistors DST. The source select transistors SST are connected between the source line SL and the memory cells C1, and the drain select transistors DST are connected between the bit lines BL1 to BLm and the memory cells Cn. Gates of the source select transistors SST are connected to the local source select line LSSL, gates of the memory cells C1 to Cn are connected to the local word lines LWL1 to LWLn, and gates of the drain select transistors DST are connected to the local drain select lines LDSL.

Figure 8:
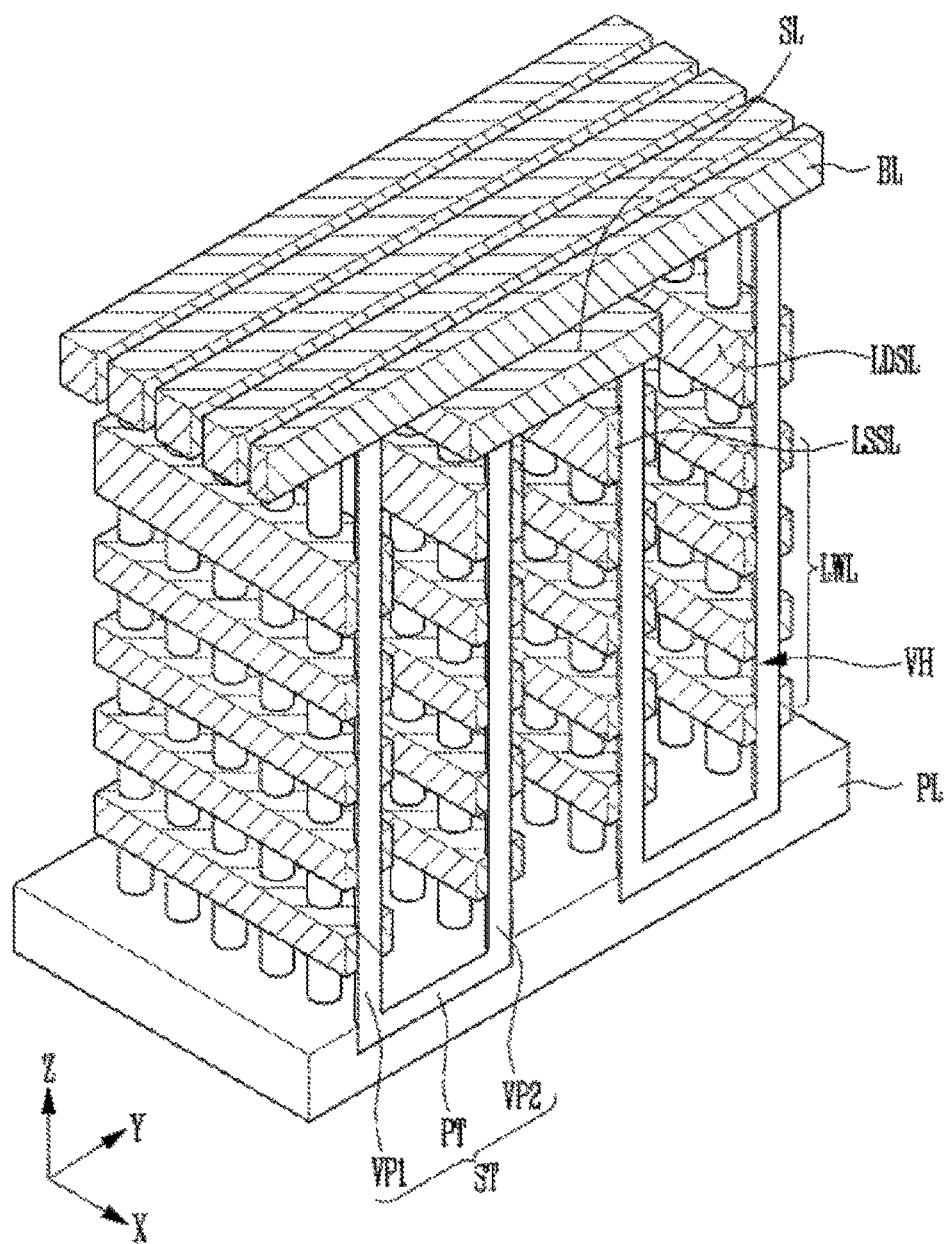
FIG. 8 is a perspective view for describing another exemplary embodiment of a memory block having a 3D structure.

FIG. 8 is a perspective view for describing another exemplary embodiment of a memory block having a 3D structure.

Referring to FIG. 8, the memory block having the 3D structure includes first and second vertical plugs VP1 and VP2 vertically (Z-direction) formed on a substrate and arranged between bit lines BL and a source line SL, and a pipe transistor PT connecting the first and second vertical plugs VP1 and VP2 to each other.

For example, the cell string may be formed in the form of "U" in which the first and second vertical plugs VP1 and VP2 are connected to each other through the pipe transistor PT. Such a structure is also called a Pipe-shaped Bit Cost Scalable (P-BiCS) structure.

The first vertical plug VP1 is connected to the pipe transistor PT by vertically passing through local word lines LWL and local drain select lines LDSL which are arranged in the first direction (Y-direction) and laminated while being spaced apart from each other, and includes a plurality of memory cells. The second vertical plug VP2 is connected to the pipe transistor PT by vertically passing through the local word lines LWL and local source select lines LSSL which are arranged in the first direction (Y-direction) and laminated while being spaced apart from each other, and includes a plurality of memory cells. A gate of the pipe transistor PT is connected to a pipe line PL, and is horizontally formed the substrate. The bit lines BL may be arranged in the second direction (X-direction) orthogonal to the first direction (Y-direction) while being in contact with an upper portion of the first vertical plug VP1 protruding to an upper portion of the local drain select line DSL.

Figure 9:
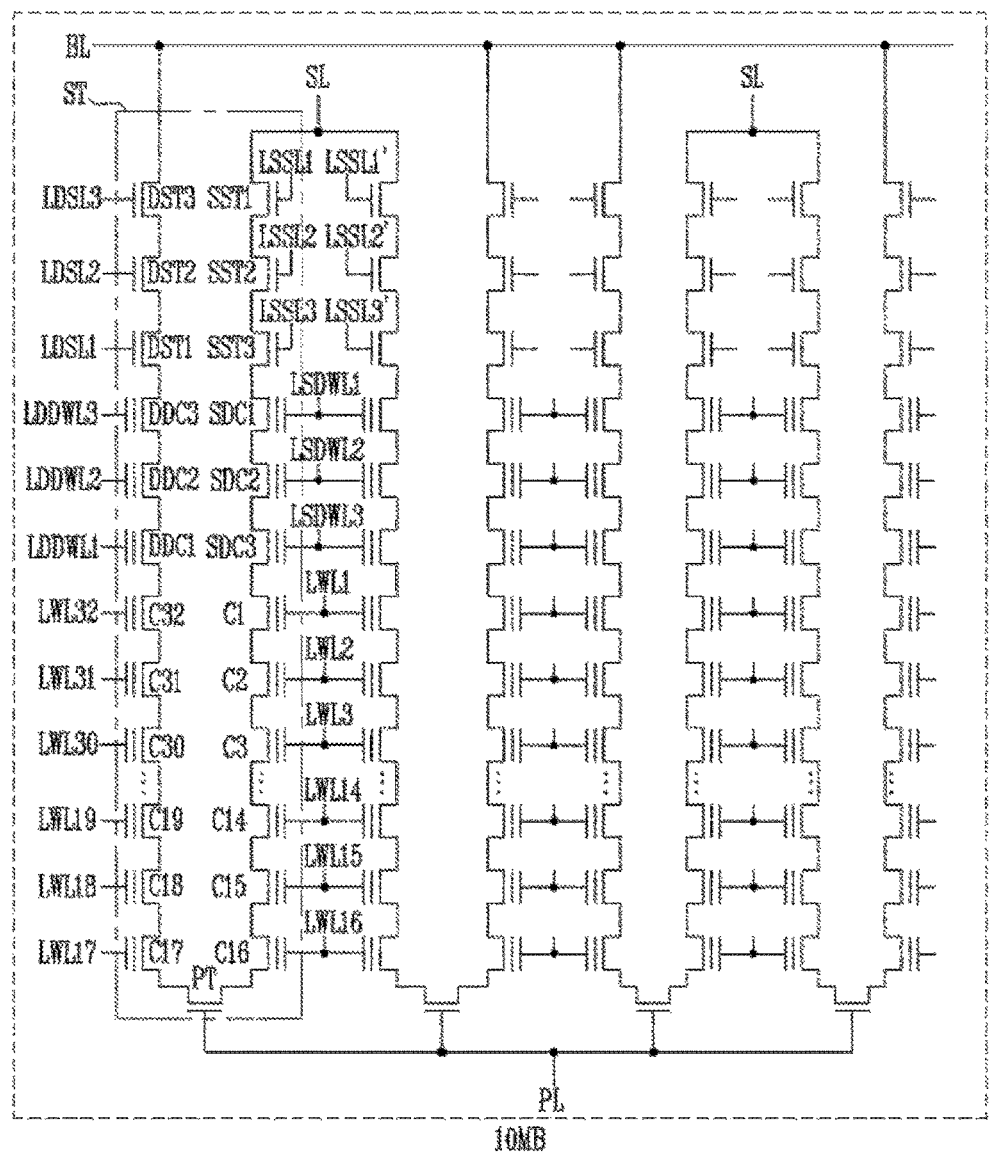
FIG. 9 is a circuit diagram illustrating the memory block of FIG. 8.

FIG. 9 is a circuit diagram for describing the memory block of FIG. 8.

Referring to FIG. 9, the memory block 10MB includes a plurality of memory strings ST connected to the bit lines. Each cell string ST in the P-BiCS structure may include source select transistors SST[1:3], dummy memory cells SDC[1:3], and main memory cells C[1:16] which are vertically connected between the source line SL and the pipe transistor PT, and drain select transistors DST[3:1], dummy memory cells DDC [3:1], and main memory cells C[32;17] which are vertically connected between the bit line BL and the pipe transistor PT. The dummy memory cells SDC[1:3] and DDC[3:1] may be omitted depending on a semiconductor device. Further, the numbers of source select transistors SST[1:3], drain select transistors DST[3:1], dummy memory cells SDC[1:3] and DDC [3:1], and main memory cells C[1:32] may be different depending on a semiconductor device.

The source select transistors SST[1:3] are controlled by a voltage applied to local source select lines LSSL[1:3], and the drain select transistors DST[3:1] are controlled by a voltage applied to local drain select lines LDSL[3:1]. The dummy memory cells SDC[1:3] and DDC [3:1] are controlled by a voltage applied to laminated dummy word lines DDWL[3:1] and SDWL[1:3]. The main memory cells C[0:32] are controlled by a voltage applied to laminated main word lines WL[1:32].

Figure 10:
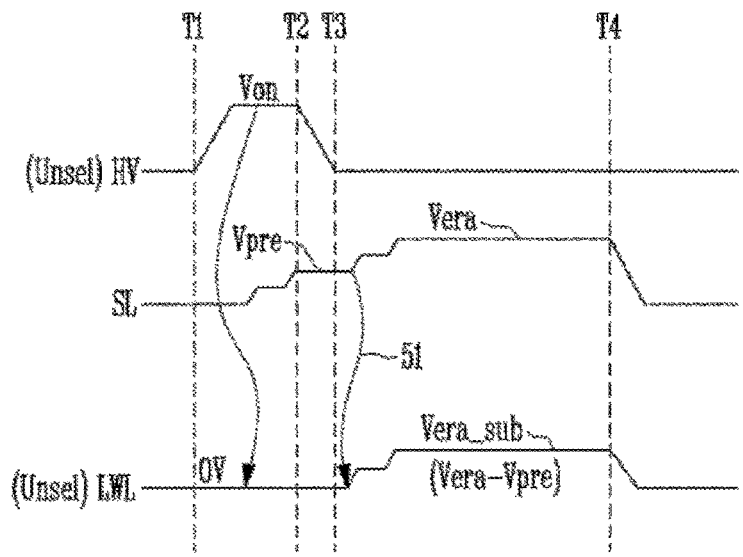
FIG. 10 is a timing diagram for describing an erase operation according to an example embodiment of the present disclosure.

FIG. 10 is a timing diagram for describing an erase operation according to an example embodiment of the present disclosure.

A voltage that may be applied to signal lines coupled to non-selected memory blocks during an erase operation of a selected memory block will be described with reference to FIG. 10. An erase operation described below is applicable to the memory blocks having the aforementioned various structures.

Before an erase voltage Vera is applied to the source line SL, all of the local word lines LWL coupled to non-selected memory blocks Unsel are set at ground. Next, a pre-erase voltage Vpre and the erase voltage Vera are sequentially applied to the source line SL. The erase operation in accordance with an embodiment will be described in detail below.

The erase operation may include a ground voltage application operation T1 to T3 and an erase operation T3 to T4, which are sequentially performed.

When the ground voltage application operation T1 to T3 starts, a high voltage HV is applied to pass switching circuits coupled to the non-selected memory blocks Unsel as a turn-on voltage Von to couple the global lines GDSL, GWL, and GSSL (see FIG. 2) to the local lines LDSL, LWL, and LSSL (see FIG. 2). Next, when the global word lines GWL are pulled to ground, the local word lines LWL coupled to the non-selected memory blocks Unsel are also pulled to ground. Then the pre-erase voltage Vpre is applied to the source line SL. When the erase voltage Vera, which is a high voltage, is suddenly applied to the source line SL, a bulk and the memory cells may get stressed, and thus in order to decrease stress, the pre-erase voltage Vpre has a lower level than the erase voltage Vera. Further, even when the pre-erase voltage Vpre is applied, a level of the erase voltage is increased from zero volts in stages to reach the level of the pre-erase voltage Vpre in order to reduce stress.

A voltage applied to the source line SL may cause the voltage on the local word lines LWL coupled to the memory blocks adjacent to the source line SL to change. For example, when the voltage applied to the source line SL is increased, voltage on the local word lines LWL coupled to the non-selected memory blocks Unsel may be increased by coupling phenomenon between the source line SL and the local word lines LWL. However, as described above, because the voltage on the local word lines LWL coupled to the non-selected memory blocks Unsel is maintained at ground, even if the pre-erase voltage Vpre is applied to the source line SL, the voltage on the local word lines coupled to the non-selected memory blocks Unsel are not increased.

After the pre-erase voltage Vpre is applied to the source line SL, at the point in time T2, the pass switching circuits connected to the non-selected memory blocks Unsel are pulled to ground. That is, pass switches included in the pass switching circuits coupled to the non-selected memory blocks Unsel are turned off.

When the erase operation T3 and T4 starts, the erase voltage Vera is applied to the source line SL that has been applied with the pre-erase voltage Vpre. In this case, even if the voltage on the local word lines LWL coupled to the non-selected memory blocks Unsel are increased by the erase voltage Vera (51), it may only be increased up to a sub erase voltage Vera_sub, which is lower than the erase voltage Vera. For example, the sub erase voltage Vera_sub may be lower than the erase voltage Vera by the pre-erase voltage Vpre.

Accordingly, it is possible to decrease stress on the memory cells included in the non-selected memory blocks Unsel during the erase operation of the memory cells included in the selected memory block.

Figure 11:
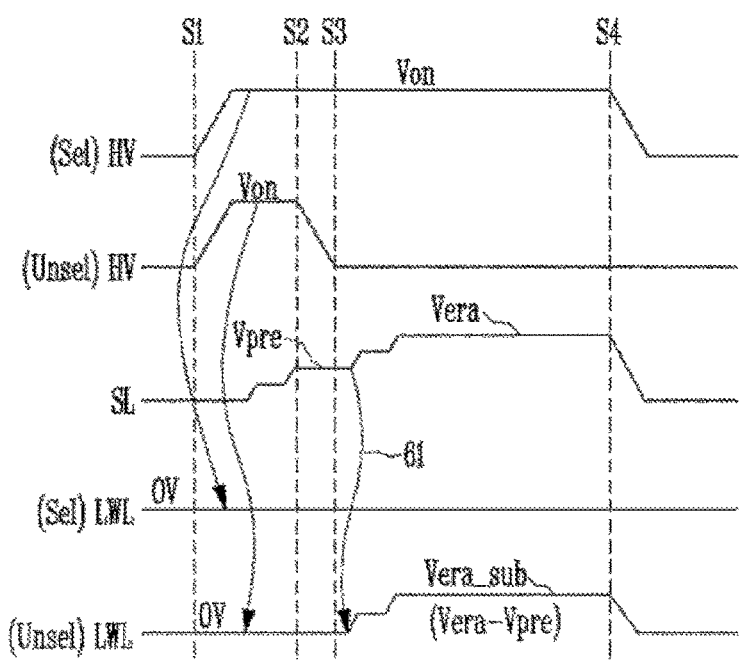
FIG. 11 is a timing diagram for describing an erase operation according to an example embodiment of the present disclosure.

FIG. 11 is a timing diagram for describing an erase operation according to an example embodiment of the present disclosure.

Referring to FIG. 11, before an erase voltage Vera is applied to the source line SL, all of the local word lines LWL coupled to a selected memory block Sel and non-selected memory blocks Unsel are set at ground. Next, a pre-erase voltage Vpre is applied to the source line SL, and a pass switching circuit coupled to the selected memory block Sel is activated, and then the erase voltage Vera is applied to the source line SL. The erase operation in accordance with an embodiment will be described in detail below.

The erase operation may include a ground voltage application operation S1 to S3 and an erase operation S3 to S4, which are sequentially performed.

When the ground voltage application operation S1 to S3 starts, a high voltage HV is applied to pass switching circuits coupled to the selected memory block SEL and the non-selected memory blocks Unsel as a turn-on voltage Von to couple the global lines GDSL, GWL, and GSSL (see FIG. 2) to the local lines LDSL, LWL, and LSSL (see FIG. 2). Next, when the global word lines GWL are pulled to ground, the voltage on the local word lines LWL coupled to the selected memory block SEL and the non-selected memory blocks Unsel are also pulled to ground. Then the pre-erase voltage Vpre is applied to the source line SL. When the erase voltage Vera, which is a high voltage, is suddenly applied to the source line SL, a bulk and the memory cells may get stressed, and thus in order to decrease stress, the pre-erase voltage Vpre has a lower level than the erase voltage Vera. Further, even when the pre-erase voltage Vpre is applied, a level of the erase voltage is increased from zero volts in stages to reach the level of the pre-erase voltage Vpre in order to reduce stress.

A voltage applied to the source line SL may cause the voltage on the local word lines LWL coupled to the memory blocks adjacent to the source line SL to change. For example, when the voltage applied to the source line SL is increased, voltage on the local word lines LWL may be increased by coupling phenomenon between the source line SL and the local word lines LWL. However, as described above, because the voltage on the local word lines LWL coupled to the selected memory block Sel and the non-selected memory blocks Unsel is maintained at ground, even if the pre-erase voltage Vpre is applied to the source line SL, the voltage on the local word lines coupled to the selected memory block Sel and the non-selected memory blocks Unsel are not increased.

After the pre-erase voltage Vpre is applied to the source line SL, at the point in time S2, the pass switching circuits coupled to the non-selected memory blocks Unsel are pulled to ground. That is, pass switches included in the pass switching circuits coupled to the non-selected memory blocks Unsel are turned off.

When the erase operation S3 and S4 starts, the erase voltage Vera is applied to the source line SL that has been applied with the pre-erase voltage Vpre. In this case, even if the voltage on the local word lines LWL coupled to the non-selected memory blocks Unsel are increased by the erase voltage Vera (61), it may only be increased up to a sub erase voltage Vera_sub, which is lower than the erase voltage Vera. For example, the sub erase voltage Vera_sub may be lower than the erase voltage Vera by the pre-erase voltage Vpre.

Accordingly, it is possible to decrease stress on the memory cells included in the non-selected memory blocks Unsel during the erase operation of the memory cells included in the selected memory block.

Figure 12:
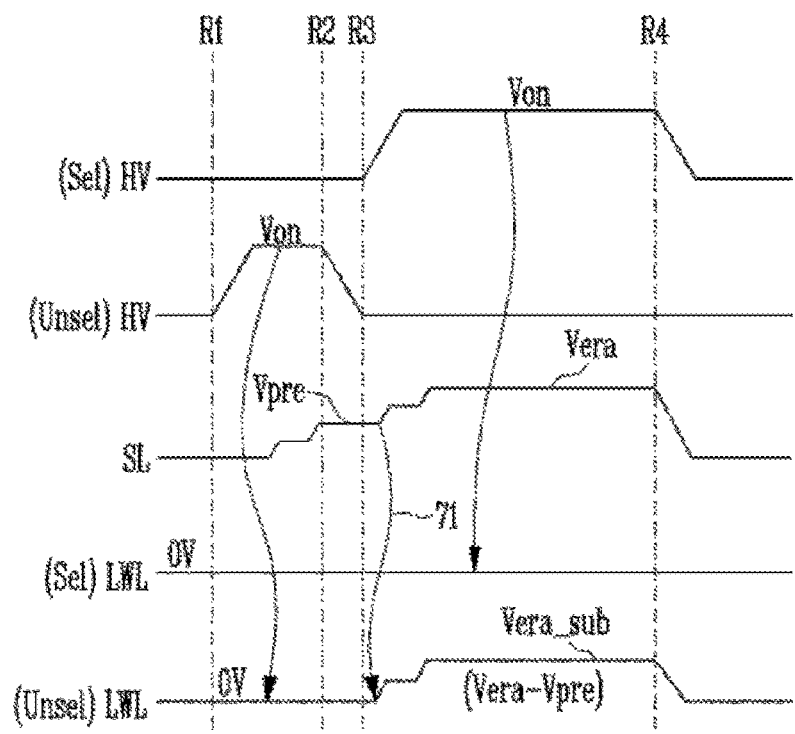
FIG. 12 is a timing diagram for describing an erase operation according to an example embodiment of the present disclosure.

FIG. 12 is a timing diagram for describing an erase operation according to an example embodiment of the present disclosure.

Referring to FIG. 12, before an erase voltage Vera is applied to the source line SL, all of the local word lines LWL coupled to non-selected memory blocks Unsel are set at ground. Next, a pre-erase voltage Vpre is applied to the source line SL, and a pass switching circuit coupled to the selected memory block Sel is activated, and then the erase voltage Vera is applied to the source line SL. The erase operation in accordance with an embodiment will be described in detail below.

The erase operation may include a ground voltage application operation R1 to R3 and an erase operation R3 to R4, which are sequentially performed.

When the ground voltage application operation R1 to R3 starts, a high voltage HV is applied to pass switching circuits coupled to the non-selected memory blocks Unsel as a turn-on voltage Von to couple the global lines GDSL, GWL, and GSSL (see FIG. 2) to the local lines LDSL, LWL, and LSSL (see FIG. 2). In this case, the high voltage HV is not applied to the pass switching circuit coupled to the selected memory block Sel. Accordingly, the local lines LDSL, LWL, and LSSL (see FIG. 2) coupled to a selected memory block Sel are not coupled to the global lines GDSL, GWL, and GSSL (see FIG. 2). Next, when the global word lines GWL are pulled to ground, the local word lines LWL coupled to the non-selected memory blocks Unsel are also pulled to ground. Then the pre-erase voltage Vpre is applied to the source line SL. When the erase voltage Vera, which is a high voltage, is suddenly applied to the source line SL, a bulk and the memory cells may get stressed, and thus in order to decrease stress, the pre-erase voltage Vpre has a lower level than the erase voltage Vera. Further, even when the pre-erase voltage Vpre is applied, a level of the erase voltage is increased from zero volts in stages to reach the level of the pre-erase voltage Vpre in order to reduce stress.

A voltage applied to the source line SL may cause the voltage level of the local word lines LWL coupled to the memory blocks adjacent to the source line SL to change. For example, when a voltage applied to the source line SL is increased, voltage levels of the local word lines LWL connected to the non-selected memory blocks Unsel may be increased by coupling phenomenon between the source line SL and the local word lines LWL. However, as described above, because the voltage on the local word lines LWL coupled to the non-selected memory blocks Unsel is maintained at ground, even if the pre-erase voltage Vpre is applied to the source line SL, the voltage on the local word lines coupled to the non-selected memory blocks Unsel are not increased.

After the pre-erase voltage Vpre is applied to the source line SL, at the point in time R2, the pass switching circuits coupled to the non-selected memory blocks Unsel are pulled to ground. That is, pass switches included in the pass switching circuits coupled to the non-selected memory blocks Unsel are turned off.

When the erase operation R3 and R4 starts, in a state where the global word lines GWL are set at ground, the high voltage HV is applied to the pass switching circuit coupled to the selected memory block Sel as the turn-on voltage Von. That is, the pass switching circuit coupled to the selected memory block Sel is activated, and the pass switching circuits coupled to the remaining non-selected memory blocks Unsel are inactivated. Accordingly, the local word lines LWL coupled to the non-selected memory blocks Unsel may float, and the local word lines LWL coupled to the selected memory blocks Sel are pulled to ground.

Next, an erase voltage Vera is applied to the source line SL that has been applied with the pre-erase voltage Vpre. In this case, even if the voltage on the local word lines LWL coupled to the non-selected memory blocks Unsel are increased by the erase voltage Vera (71), it may only be increased up to a sub erase voltage Vera_sub, which is lower than the erase voltage Vera. For example, the sub erase voltage Vera_sub may be lower than the erase voltage Vera by the pre-erase voltage Vpre. Accordingly, during the time period between the points in time R3 and R3 when an erase operation is performed on the memory cells included in the selected memory block Sel, the memory cells included in the non-selected memory blocks may be prevented from being erased while reducing stress.

Accordingly, it is possible to decrease stress on the memory cells included in the non-selected memory blocks Unsel during the erase operation of the memory cells included in the selected memory block.

Further, it is possible to decrease stress on the pass switching circuits PS1 to PSk included in the row decoder 22 (see FIG. 2) by preventing the voltages on the local word lines LWL coupled to the non-selected memory blocks Unsel from being increased during the erase operation, thereby securing a breakdown voltage margin of the row decoder. That is, it does not need to increase an interval between the lines or a length of the lines to secure the breakdown voltage margin, thereby reducing the size of the semiconductor device.

Figure 13:
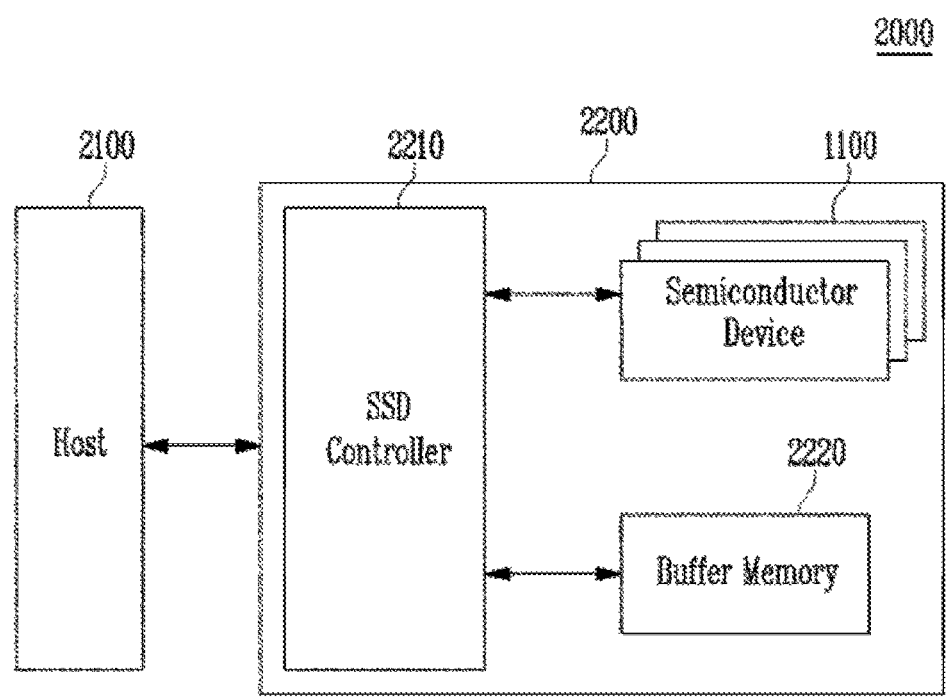
FIG. 13 is a block diagram for describing a solid state drive including the semiconductor device according to an example embodiment of the present disclosure.

FIG. 13 is a block diagram for describing a solid state drive including the semiconductor device according to an example embodiment of the present disclosure.

Referring to FIG. 13, a drive device 2000 includes a host 2100 and a Solid Disk Drive (SSD) 2200. The SSD 2200 includes an SSD controller 2210, a buffer memory 2220, and the semiconductor device 1100.

The SSD controller 2210 connects the host 2100 and the SSD 2200. That is, the SSD controller 2210 provides an interface between the SSD 2200 and the host 2100 in accordance with a bus format of the host 2100. The SSD controller 2210 decodes a command provided from the host 2100. The SSD controller 2210 accesses the semiconductor device 1100 according to a result of the decoding. The bus format of the host 2100 may include a Universal Serial Bus (USB), a Small Computer System Interface (SCSI), PCI process, ATA, Parallel ATA (PATA), Serial ATA (SATA), and Serial Attached SCSI (SCSI).

Program data provided from the host 2100 and data read from the semiconductor device 1100 is temporarily stored in the buffer memory 2220. When data existing in the semiconductor device 1100 is cached when a read request is made from the host 2100, the buffer memory 2200 supports a cache function for directly providing the cached data to the host 2100. In general, a data transmission speed of the bus format (e.g., SATA or SAS) provided by the host 2100 may be faster than a transmission speed of a memory channel. That is, when the data transmission speed at an interface of the host 2100 is faster than the data transmission speed of the memory channel of the SSD 2200, it is possible to minimize the performance degradation due to a difference in the data transmission by providing the buffer memory 2220 with large capacity. The buffer memory 2220 may include a synchronous DRAM.

The semiconductor device 1100 is provided as a storage medium of the SSD 2200. For example, the semiconductor device 1100 may be provided as a non-volatile memory device having large data storage capacity such as a NAND-type flash memory.

Figure 14:
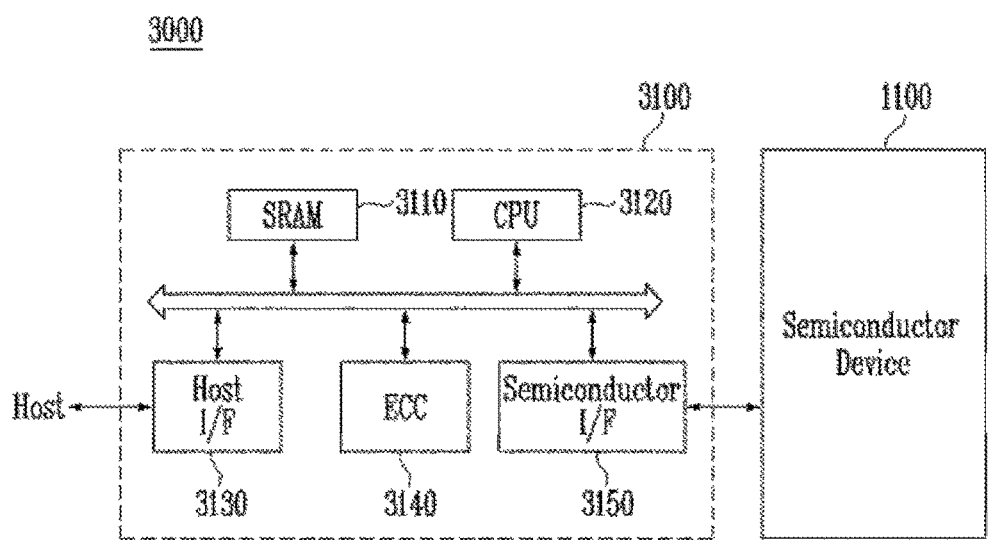
FIG. 14 is a block diagram for describing a memory system including the semiconductor device according to an example embodiment of the present disclosure.

FIG. 14 is a block diagram for describing a memory system including the semiconductor device according to an example embodiment of the present disclosure.

Referring to FIG. 14, a memory system 3000 according to the present disclosure may include a memory controller 3100 and the semiconductor device 1100.

The semiconductor device 1100 may have a configuration the same or substantially the same as that of FIG. 1, so that a detailed description of the semiconductor device 1100 will be omitted.

The memory controller 3100 may perform reading and writing operations to the semiconductor device 1100. The SRAM 3110 may be used as a working memory of a CPU 3120. A host interface 3130 may include a data exchange protocol of a host connected to a memory system 3000. An error correction circuit 3140 provided in the memory controller 3100 may detect and correct an error included in data read from the semiconductor device 1100. A semiconductor interface 3150 may interface with the semiconductor device 1100. The CPU 3120 may perform a control operation for exchanging data between the memory controller 3100 and the semiconductor device 1100. Further, although not illustrated in FIG. 14, the memory system 3000 may further include a ROM (not illustrated) for storing code data for interfacing with the host.

The memory system 3000 according to an embodiment may be applied to one of a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder, a digital picture player, a digital video recorder, a digital video player, a device capable of transceiving information in a wireless environment, and various devices configuring a home network.

Figure 15:
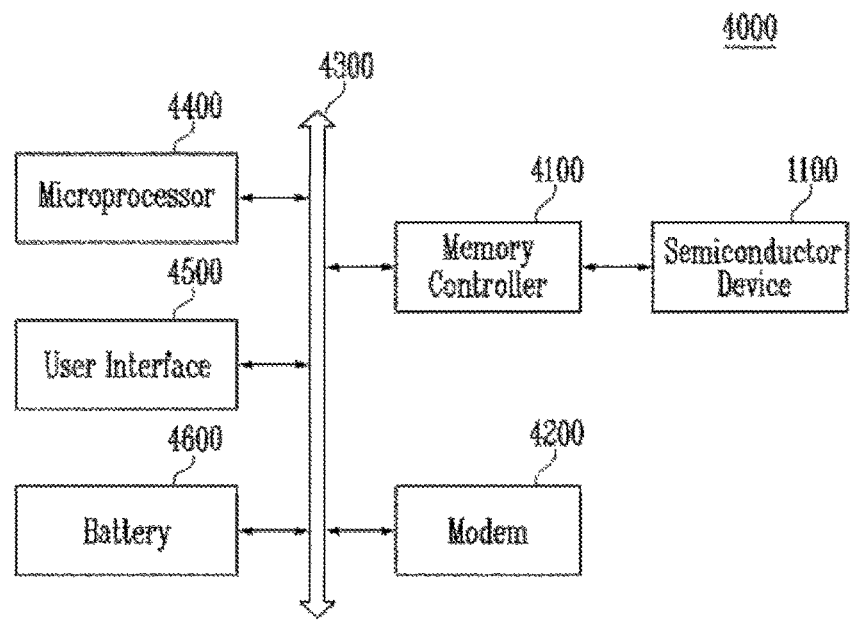
FIG. 15 is a diagram for describing a schematic configuration of a computing system including the semiconductor device according to an example embodiment of the present disclosure.

FIG. 15 is a diagram for describing a schematic configuration of a computing system including the semiconductor device according to an example embodiment of the present disclosure.

Referring to FIG. 15, a computer system 4000 according to an embodiment of the present disclosure includes the semiconductor device 1100, the memory controller 4100, a modem 4200, a microprocessor 4400, and a user interface 4500, which are electrically connected to a bus 4300. In a case where the computing system 4000 according to an embodiment of the present disclosure is a mobile device, a battery 4600 for supplying an operation voltage of the computer system 4000 may be further provided. Although it is not illustrated in the drawing, the computer system 4000 according to the present disclosure may further include an application chipset, a Camera Image Processor (CIS), a mobile DRAM, and the like.

The semiconductor device 1100 may have a configuration the same or substantially the same as that of FIG. 1, so that a detailed description of the semiconductor device 1100 will be omitted.

The memory controller 4100 and the semiconductor device 1100 may configure an SSD.

The semiconductor device and the memory controller according to an embodiment of the present disclosure may be embedded by using various forms of package. For example, the semiconductor device and the memory controller according to an embodiment of the present disclosure may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), and wafer-level processed stack package (WSP).

As described above, the embodiment has been disclosed in the drawings and the specification. The specific terms used herein are for purposes of illustration, and do not limit the scope of the present disclosure defined in the claims. Accordingly, those skilled in the art will appreciate that various modifications and another equivalent example may be made without departing from the scope and spirit of the present disclosure. Therefore, the sole technical protection scope of the present disclosure will be defined by the technical spirit of the accompanying claims.

What is claimed is:

1. A semiconductor device, comprising:
   a plurality of memory blocks including cell strings coupled between bit lines and a source line;
   a peripheral circuit configured to perform an erase operation on a selected memory block among the plurality of memory blocks; and
   a control circuit configured to control the peripheral circuit, so that when an erase command is received, local word lines coupled to a non-selected memory block among the plurality of memory blocks are pulled to ground, the local word lines coupled to the non-selected memory block float after a pre-erase voltage lower than an erase voltage is applied to the source line, and the erase operation of the selected memory block is performed by applying the erase voltage to the source line.

2. The semiconductor device of claim 1, wherein the source line is arranged between the memory blocks and cell strings.

3. The semiconductor device of claim 1, wherein the peripheral circuit includes:
   a voltage generating circuit configured to apply the pre-erase voltage, the erase voltage, and a turn-on voltage to global lines or the source line in response to an operation signal;
   a row decoder coupled to the voltage generating circuit through the global lines and to the memory blocks through the local lines including the local word lines, the row decoder being configured to connect local lines coupled to selected memory blocks among the plurality of memory blocks to the global lines in response to a row address;
   a page buffer coupled to the memory blocks through the bit lines, a page buffer being configured to exchange data with a selected memory block during a program, read, and erase operation in response to a page buffer control signal, and temporarily store received data;
   a column decoder configured to exchange data with the page buffer in response to a column address; and
   an input/output circuit configured to transmit a command and an address received from the outside to the control circuit, transmit data received from the outside to the column decoder, and output data received from the column decoder to the outside.

4. The semiconductor device of claim 3, wherein the control circuit outputs the operation signal, the row address, the page buffer control signal, and the column address in response to the command received from the outside.

5. The semiconductor device of claim 3, wherein the row decoder includes:
   a high voltage generating circuit configured to generate high voltages in response to the row decoder; and
   pass switching circuits coupled between the local lines and the global lines, each local line being coupled to one of the memory blocks, the pass switching circuits being configured to transmit voltages applied to the global lines to selected memory blocks in response to the high voltages.

6. A method of operating a semiconductor device, comprising:
   setting first word lines coupled to the first memory blocks at ground;
   applying a pre-erase voltage lower than an erase voltage to a source line that has been applied with the erase voltage;
   floating the first word lines; and
   performing an erase operation on memory cells included in a second memory block by applying the erase voltage to the source line.

7. The method of claim 6, wherein performing the erase operation on the memory cells included in the second memory block includes pulling down second word lines coupled to the second memory block to ground before the erase voltage is applied to the source line.

8. The method of claim 6, further comprising:
   simultaneously pulling down second word lines coupled to the second memory block to ground when the first word lines coupled to the first memory blocks are pulled to ground.

9. A method of operating a semiconductor device, comprising:
   coupling global word lines to local word lines coupled to non-selected memory blocks;
   setting the global word lines at ground;
   applying a pre-erase voltage to a source line arranged between memory blocks;
   floating local word lines coupled to the non-selected memory blocks;
   coupling the global word lines to local word lines coupled to a selected memory block; and
   performing an erase operation on memory cells included in the selected memory block by applying an erase voltage higher than the pre-erase voltage to the source line.

10. The method of claim 9, wherein coupling the global word lines to the local word lines coupled to the non-selected memory block includes turning on pass transistors coupled between the global word lines and local word lines coupled to the non-selected memory blocks.

11. The method of claim 10, further comprising:
when the pass transistors coupled between the global word lines and the local word lines coupled to the non-selected memory blocks are turned on, turning on pass transistors coupled between the global word lines and local word lines coupled to the selected memory blocks.

12. The method of claim 9, wherein the pre-erase voltage is between zero volts and the erase voltage.

13. The method of claim 9, wherein applying the pre-erase voltage to the source line includes increasing a voltage on the source line in stages up to the pre-erase voltage.

14. The method of claim 9, wherein, when coupling the global word lines to the local word lines coupled to the selected memory block, the global word lines are maintained at ground.

15. The method of claim 9, wherein erasing the memory cells included in the selected memory block includes increasing a voltage on the source line that has been applied with the pre-erase voltage in stages up to the erase voltage.

* * * * *